(12) United States Patent
Liu et al.

(10) Patent No.: US 10,707,121 B2
(45) Date of Patent: Jul. 7, 2020

(54) SOLID STATE MEMORY DEVICE, AND MANUFACTURING METHOD THEREOF

(71) Applicant: Intel Corporation, Santa Clara, CA (US)

(72) Inventors: Jun Liu, Boise, ID (US); Mark A. Levan, Boise, ID (US); Gordon A. Haller, Boise, ID (US); Fei Wang, Boise, ID (US); Wei Yeeng Ng, Boise, ID (US); Wesley O. McKinsey, Nampa, ID (US); Zhiqiang Xie, Meridian, UM (US); Jeremy F. Adams, Boise, ID (US); Hongbin Zhu, Boise, ID (US); Jun Zhao, Boise, ID (US)

(73) Assignee: Intel Corporatino, Santa Clara, CA (US)

( * ) Notice: Subject to any disclaimer, the term of this patent is extended or adjusted under 35 U.S.C. 154(b) by 0 days.

(21) Appl. No.: 15/396,469

(22) Filed: Dec. 31, 2016

(65) Prior Publication Data

US 2018/0190540 A1      Jul. 5, 2018

(51) Int. Cl.
*H01L 21/768* (2006.01)
*H01L 27/11575* (2017.01)
(Continued)

(52) U.S. Cl.
CPC .. *H01L 21/76831* (2013.01); *H01L 21/76805* (2013.01); *H01L 21/76816* (2013.01); *H01L 21/76877* (2013.01); *H01L 23/528* (2013.01); *H01L 23/5226* (2013.01); *H01L 23/5286* (2013.01); *H01L 23/5329* (2013.01); *H01L 23/53214* (2013.01); *H01L 23/53242* (2013.01); *H01L 23/53257* (2013.01);
(Continued)

(58) Field of Classification Search
CPC ......... H01L 27/11556; H01L 27/11582; H01L 27/11524; H01L 27/11529; H01L 27/1157; H01L 27/11531; H01L 27/11551; H01L 27/11563; G11C 16/0483
See application file for complete search history.

(56) References Cited

U.S. PATENT DOCUMENTS 5,712,177 A *   1/1998  Kaushik ............ H01L 21/28185
                                                        438/591
9,601,577 B1 *  3/2017  Lee .................... H01L 27/11578
(Continued)

OTHER PUBLICATIONS

International Search Report dated Jun. 15, 2018, in International Application No. PCT/US2018/012022, filed Jan. 2, 2018; 6 pages.

*Primary Examiner* — Maliheh Malek
(74) *Attorney, Agent, or Firm* — Thorpe North & Western, LLP; David W. Osborne

(57) ABSTRACT

Conductive structure technology is disclosed. In one example, a conductive structure can include an interconnect and a plurality of conductive layers overlying the interconnect. Each conductive layer can be separated from an adjacent conductive layer by an insulative layer. In addition, the conductive structure can include a contact extending through the plurality of conductive layers to the interconnect. The contact can be electrically coupled to the interconnect and insulated from the plurality of conductive layers. Associated systems and methods are also disclosed.

24 Claims, 12 Drawing Sheets

(51) Int. Cl.
*H01L 27/11573* (2017.01)
*H01L 27/11526* (2017.01)
*H01L 27/11548* (2017.01)
*H01L 23/528* (2006.01)
*H01L 23/522* (2006.01)
*H01L 23/532* (2006.01)
*H01L 27/11582* (2017.01)
*H01L 27/11556* (2017.01)

(52) U.S. Cl.
CPC .. *H01L 23/53271* (2013.01); *H01L 27/11526* (2013.01); *H01L 27/11548* (2013.01); *H01L 27/11573* (2013.01); *H01L 27/11575* (2013.01); *H01L 27/11556* (2013.01); *H01L 27/11582* (2013.01)

(56) References Cited

U.S. PATENT DOCUMENTS

| | | | |
|---|---|---|---|
| 9,620,512 B1* | 4/2017 | Nishikawa | H01L 27/11524 |
| 9,673,213 B1* | 6/2017 | Yu | H01L 23/535 |
| 9,728,546 B2* | 8/2017 | Serov | H01L 27/11556 |
| 9,741,734 B2* | 8/2017 | Zhu | H01L 27/11582 |
| 9,881,929 B1* | 1/2018 | Ravikirthi | H01L 27/11519 |
| 10,388,665 B1* | 8/2019 | Xie | H01L 21/0228 |
| 10,566,336 B1* | 2/2020 | Guo | H01L 27/11556 |
| 2009/0283819 A1* | 11/2009 | Ishikawa | H01L 21/28282 257/324 |
| 2010/0155810 A1* | 6/2010 | Kim | H01L 27/11548 257/316 |
| 2010/0270593 A1 | 10/2010 | Lung et al. | |
| 2010/0327339 A1* | 12/2010 | Tanaka | H01L 27/11573 257/324 |
| 2011/0024818 A1* | 2/2011 | Ahn | H01L 21/28273 257/314 |
| 2011/0057250 A1* | 3/2011 | Higashi | H01L 27/11578 257/324 |
| 2012/0001247 A1* | 1/2012 | Alsmeier | H01L 27/11551 257/316 |
| 2012/0012921 A1* | 1/2012 | Liu | H01L 27/11565 257/326 |
| 2012/0077320 A1* | 3/2012 | Shim | H01L 27/11582 438/269 |
| 2012/0112171 A1* | 5/2012 | Hattori | H01L 27/1157 257/40 |
| 2012/0115293 A1* | 5/2012 | Noh | H01L 27/10855 438/239 |
| 2012/0168858 A1* | 7/2012 | Hong | H01L 27/11573 257/330 |
| 2012/0205777 A1* | 8/2012 | Lee | H01L 21/743 257/508 |
| 2012/0217564 A1* | 8/2012 | Tang | H01L 27/11524 257/315 |
| 2012/0231593 A1* | 9/2012 | Joo | H01L 27/11556 438/264 |
| 2012/0256247 A1* | 10/2012 | Alsmeier | H01L 21/764 257/319 |
| 2012/0306090 A1 | 12/2012 | Smith et al. | |
| 2013/0100741 A1* | 4/2013 | Choi | H01L 27/11565 365/185.18 |
| 2013/0134492 A1* | 5/2013 | Yang | H01L 27/1157 257/314 |
| 2013/0168800 A1* | 7/2013 | Shim | H01L 29/0657 257/499 |
| 2013/0270625 A1* | 10/2013 | Jang | H01L 29/7926 257/324 |
| 2013/0334589 A1* | 12/2013 | Ahn | H01L 29/7926 257/324 |
| 2014/0008714 A1* | 1/2014 | Makala | H01L 21/28273 257/324 |
| 2014/0027826 A1* | 1/2014 | Assefa | H01L 35/34 257/290 |
| 2014/0042512 A1* | 2/2014 | Jeon | H01L 27/1052 257/314 |
| 2014/0061750 A1* | 3/2014 | Kwon | H01L 27/1052 257/314 |
| 2014/0131784 A1* | 5/2014 | Davis | H01L 27/11556 257/316 |
| 2014/0175532 A1* | 6/2014 | Chen | H01L 29/66833 257/324 |
| 2014/0273462 A1* | 9/2014 | Simsek-Ege | H01L 27/11578 438/696 |
| 2014/0284695 A1* | 9/2014 | Won | H01L 29/7926 257/324 |
| 2014/0291747 A1* | 10/2014 | Simsek-Ege | H01L 29/7889 257/316 |
| 2014/0334230 A1* | 11/2014 | Kwon | H01L 27/11582 365/185.11 |
| 2015/0108562 A1* | 4/2015 | Chen | H01L 27/11582 257/324 |
| 2015/0123188 A1* | 5/2015 | Lu | H01L 27/11556 257/321 |
| 2015/0123189 A1* | 5/2015 | Sun | H01L 27/11556 257/321 |
| 2015/0171098 A1* | 6/2015 | Simsek-Ege | H01L 27/11556 257/321 |
| 2015/0255479 A1* | 9/2015 | Sakuma | H01L 27/11556 257/316 |
| 2015/0270280 A1* | 9/2015 | Simsek-Ege | H01L 27/11582 257/66 |
| 2015/0294978 A1* | 10/2015 | Lu | H01L 27/1157 438/269 |
| 2015/0318297 A1* | 11/2015 | Hada | H01L 27/11582 438/269 |
| 2015/0348984 A1* | 12/2015 | Yada | H01L 27/11524 257/316 |
| 2015/0380422 A1* | 12/2015 | Sharangpani | H01L 27/11556 365/185.17 |
| 2016/0079269 A1* | 3/2016 | Sekine | H01L 27/11582 257/314 |
| 2016/0104717 A1* | 4/2016 | Lu | G11C 16/0483 365/185.22 |
| 2016/0104719 A1* | 4/2016 | Jung | H01L 27/11582 257/324 |
| 2016/0118401 A1* | 4/2016 | Lee | H01L 21/76 438/296 |
| 2016/0133638 A1* | 5/2016 | Simsek-Ege | H01L 27/11524 257/314 |
| 2016/0190155 A1* | 6/2016 | Lee | H01L 27/11582 438/268 |
| 2016/0204102 A1 | 7/2016 | Chen | |
| 2016/0218059 A1* | 7/2016 | Nakada | H01L 27/11556 |
| 2016/0268293 A1* | 9/2016 | Kamigaichi | H01L 27/11582 |
| 2016/0284719 A1* | 9/2016 | Zhu | H01L 27/11556 |
| 2016/0284808 A1* | 9/2016 | Yang | H01L 29/42372 |
| 2016/0300848 A1* | 10/2016 | Pachamuthu | H01L 21/768 |
| 2016/0336341 A1* | 11/2016 | Sun | H01L 27/11556 |
| 2016/0365352 A1* | 12/2016 | Nishikawa | H01L 27/11582 |
| 2017/0018509 A1* | 1/2017 | Puri | H01L 23/481 |
| 2017/0025421 A1* | 1/2017 | Sakakibara | H01L 21/28273 |
| 2017/0062330 A1* | 3/2017 | Kim | H01L 23/5226 |
| 2017/0092654 A1* | 3/2017 | Nishikawa | H01L 29/41741 |
| 2017/0110464 A1* | 4/2017 | Rabkin | H01L 27/1157 |
| 2017/0110543 A1* | 4/2017 | Shin | H01L 27/1157 |
| 2017/0117293 A1* | 4/2017 | Higuchi | H01L 27/11582 |
| 2017/0117294 A1* | 4/2017 | Lee | H01L 27/11582 |
| 2017/0125430 A1* | 5/2017 | Nishikawa | H01L 27/11524 |
| 2017/0125538 A1* | 5/2017 | Sharangpani | H01L 21/28556 |
| 2017/0148809 A1* | 5/2017 | Nishikawa | H01L 23/528 |
| 2017/0170190 A1* | 6/2017 | Zhu | H01L 27/11582 |
| 2017/0179026 A1* | 6/2017 | Toyama | H01L 23/5283 |
| 2017/0179143 A1* | 6/2017 | Tran | H01L 27/11556 |
| 2017/0179153 A1* | 6/2017 | Ogawa | H01L 27/11524 |
| 2017/0229470 A1* | 8/2017 | Zhu | H01L 27/11556 |
| 2017/0236827 A1* | 8/2017 | Hirotani | H01L 27/1157 257/326 |
| 2017/0243879 A1* | 8/2017 | Yu | H01L 21/0214 |
| 2017/0263613 A1* | 9/2017 | Murakoshi | H01L 27/1157 |
| 2017/0263641 A1* | 9/2017 | Lee | H01L 27/11582 |

(56) References Cited

U.S. PATENT DOCUMENTS

| | | | |
|---|---|---|---|
| 2017/0271527 A1* | 9/2017 | Higuchi | H01L 29/7923 |
| 2017/0278859 A1* | 9/2017 | Sharangpani | H01L 27/11573 |
| 2017/0294377 A1* | 10/2017 | Dunga | H01L 23/528 |
| 2017/0294443 A1* | 10/2017 | Kim | H01L 27/11565 |
| 2017/0301685 A1* | 10/2017 | Dorhout | H01L 27/11582 |
| 2017/0309641 A1* | 10/2017 | Tanzawa | H01L 29/4966 |
| 2018/0122904 A1* | 5/2018 | Matsumoto | H01L 27/11565 |
| 2018/0286916 A1* | 10/2018 | Wang | H01L 45/04 |
| 2018/0286921 A1* | 10/2018 | Redaelli | G11C 11/5678 |
| 2018/0366386 A1* | 12/2018 | Petz | H01L 23/291 |
| 2019/0067216 A1* | 2/2019 | Zhu | H01L 23/562 |
| 2019/0081061 A1* | 3/2019 | Tessariol | H01L 27/11582 |
| 2019/0206884 A1* | 7/2019 | Ng | H01L 21/32135 |
| 2019/0333929 A1* | 10/2019 | Lee | H01L 27/11575 |
| 2020/0066739 A1* | 2/2020 | Guo | H01L 23/5226 |

* cited by examiner

A-A

SOLID STATE MEMORY DEVICE, AND MANUFACTURING METHOD THEREOF

TECHNICAL FIELD

Embodiments described herein relate generally to electronic systems, and more particularly to conductive structures of electronic systems.

BACKGROUND

Electronic systems, which are found in computers and other electronic devices, utilize a variety of conductive structures to electrically couple components to one another. One such electronic system is a memory device typically provided as a semiconductor integrated circuit. There are many different types of memory devices including random-access memory (RAM), read-only memory (ROM), synchronous dynamic random-access memory (SDRAM), dynamic random-access memory (DRAM), and non-volatile memory. In non-volatile memory (e.g., NAND flash memory), one way to increase memory density is by using a vertical memory array, which is also referred to as a three-dimensional (3-D) array.

Some vertical memory arrays include layers of conductive material (separated by layers of insulative material) that are used to provide electrical connections (e.g., word lines) so that memory cells in the array may be selected for writing or reading functions. These conductive layers extend into periphery regions about the memory array and overlie interconnects that are in electrical communication with semiconductor devices (e.g., a memory cell, a CMOS device, etc.) in the memory array. Typically, in order to form electrical connections with the interconnects, relatively large portions of the conductive and insulative layers in the periphery are removed in bulk and the voids are filled with insulative material, which is then planarized. Discrete openings are formed in the insulative material to expose the interconnects, which are then filled with conductive material to form the electrical connections with the interconnects.

BRIEF DESCRIPTION OF THE DRAWINGS

Invention features and advantages will be apparent from the detailed description which follows, taken in conjunction with the accompanying drawings, which together illustrate, by way of example, various invention embodiments; and, wherein.

Figure 1:
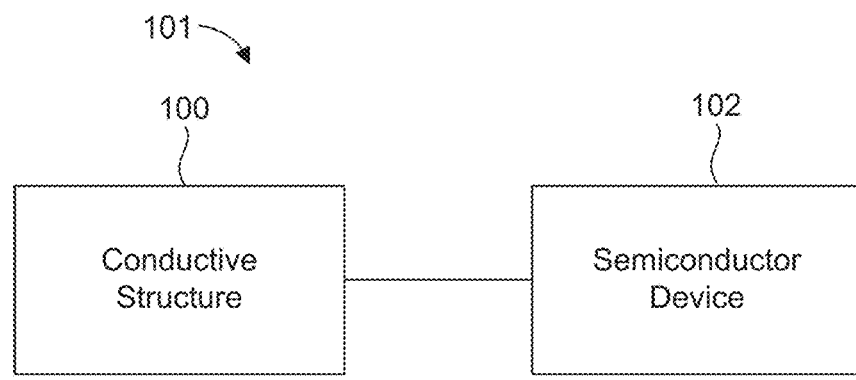
FIG. 1 illustrates a schematic block diagram of an electronic system in accordance with an example.

Reference will now be made to the exemplary embodiments illustrated, and specific language will be used herein to describe the same. It will nevertheless be understood that no limitation of the scope or to specific invention embodiments is thereby intended.

DESCRIPTION OF EMBODIMENTS

Before invention embodiments are disclosed and described, it is to be understood that no limitation to the particular structures, process steps, or materials disclosed herein is intended, but also includes equivalents thereof as would be recognized by those ordinarily skilled in the relevant arts. It should also be understood that terminology employed herein is used for the purpose of describing particular examples only and is not intended to be limiting. The same reference numerals in different drawings represent the same element. Numbers provided in flow charts and processes are provided for clarity in illustrating steps and operations and do not necessarily indicate a particular order or sequence. Unless defined otherwise, all technical and scientific terms used herein have the same meaning as commonly understood by one of ordinary skill in the art to which this disclosure belongs.

As used in this written description, the singular forms "a," "an" and "the" include express support for plural referents unless the context clearly dictates otherwise. Thus, for example, reference to "a layer" includes a plurality of such layers.

In this disclosure, "comprises," "comprising," "containing" and "having" and the like can have the meaning ascribed to them in U.S. Patent law and can mean "includes," "including," and the like, and are generally interpreted to be open ended terms. The terms "consisting of" or "consists of" are closed terms, and include only the components, structures, steps, or the like specifically listed in conjunction with such terms, as well as that which is in accordance with U.S. Patent law. "Consisting essentially of" or "consists essentially of" have the meaning generally ascribed to them by U.S. Patent law. In particular, such terms are generally closed terms, with the exception of allowing inclusion of additional items, materials, components, steps, or elements, that do not materially affect the basic and novel characteristics or function of the item(s) used in connection therewith. For example, trace elements present in a composition, but not affecting the composition's nature or characteristics would be permissible if present under the "consisting essentially of" language, even though not expressly recited in a list of items following such terminology. When using an open ended term in the written description, like "comprising" or "including," it is understood that direct support should be afforded also to "consisting essentially of" language as well as "consisting of" language as if stated explicitly and vice versa.

The terms "first," "second," "third," "fourth," and the like in the description and in the claims, if any, are used for distinguishing between similar elements and not necessarily for describing a particular sequential or chronological order. It is to be understood that the terms so used are interchangeable under appropriate circumstances such that the embodiments described herein are, for example, capable of operation in sequences other than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method.

The terms "left," "right," "front," "back," "top," "bottom," "over," "under," and the like in the description and in the claims, if any, are used for descriptive purposes and not necessarily for describing permanent relative positions. It is to be understood that the terms so used are interchangeable under appropriate circumstances such that the embodiments described herein are, for example, capable of operation in other orientations than those illustrated or otherwise described herein.

The term "coupled," as used herein, is defined as directly or indirectly connected in an electrical or nonelectrical manner. "Directly coupled" as used herein, means that the indicated structures or elements are in physical contact and attached or joined to one another. Objects described herein as being "adjacent to" each other may be in physical contact with each other, in close proximity to each other, or in the same general region or area as each other, as appropriate for the context in which the phrase is used.

Occurrences of the phrase "in one embodiment," or "in one aspect," herein do not necessarily all refer to the same embodiment or aspect.

As used herein, the term "substantially" refers to the complete or nearly complete extent or degree of an action, characteristic, property, state, structure, item, or result. For example, an object that is "substantially" enclosed would mean that the object is either completely enclosed or nearly completely enclosed. The exact allowable degree of deviation from absolute completeness may in some cases depend on the specific context. However, generally speaking the nearness of completion will be so as to have the same overall result as if absolute and total completion were obtained. The use of "substantially" is equally applicable when used in a negative connotation to refer to the complete or near complete lack of an action, characteristic, property, state, structure, item, or result. For example, a composition that is "substantially free of" particles would either completely lack particles, or so nearly completely lack particles that the effect would be the same as if it completely lacked particles. In other words, a composition that is "substantially free of" an ingredient or element may still actually contain such item as long as there is no measurable effect thereof.

As used herein, the term "about" is used to provide flexibility to a numerical range endpoint by providing that a given value may be "a little above" or "a little below" the endpoint.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary.

Concentrations, amounts, sizes, and other numerical data may be expressed or presented herein in a range format. It is to be understood that such a range format is used merely for convenience and brevity and thus should be interpreted flexibly to include not only the numerical values explicitly recited as the limits of the range, but also to include all the individual numerical values or sub-ranges encompassed within that range as if each numerical value and sub-range is explicitly recited. As an illustration, a numerical range of "about 1 to about 5" should be interpreted to include not only the explicitly recited values of about 1 to about 5, but also include individual values and sub-ranges within the indicated range. Thus, included in this numerical range are individual values such as 2, 3, and 4 and sub-ranges such as from 1-3, from 2-4, and from 3-5, etc., as well as 1, 2, 3, 4, and 5, individually.

This same principle applies to ranges reciting only one numerical value as a minimum or a maximum. Furthermore, such an interpretation should apply regardless of the breadth of the range or the characteristics being described.

Reference throughout this specification to "an example" means that a particular feature, structure, or characteristic described in connection with the example is included in at least one embodiment. Thus, appearances of the phrases "in an example" in various places throughout this specification are not necessarily all referring to the same embodiment.

Furthermore, the described features, structures, or characteristics may be combined in any suitable manner in one or more embodiments. In this description, numerous specific details are provided, such as examples of layouts, distances, network examples, etc. One skilled in the relevant art will recognize, however, that many variations are possible without one or more of the specific details, or with other methods, components, layouts, measurements, etc. In other instances, well-known structures, materials, or operations are not shown or described in detail but are considered well within the scope of the disclosure.

EXAMPLE EMBODIMENTS

An initial overview of technology embodiments is provided below and specific technology embodiments are then described in further detail. This initial summary is intended to aid readers in understanding the technology more quickly but is not intended to identify key or essential features of the technology nor is it intended to limit the scope of the claimed subject matter.

As mentioned above, in the conventional process for forming electrical connections with interconnects underlying the conductive layers, relatively large amounts of conductive and insulative material are removed in bulk and replaced with insulative material. Although effective for forming electrical contacts that are insulated, this complex process creates a variety of manufacturing difficulties (e.g., with planarization, topography, dishing, etc.) in meeting design tolerances, which impacts yield and costs.

Accordingly, conductive structures are disclosed which are formed by a simplified process that reduces or minimizes material removal (i.e., conductive and insulative layer material) in the periphery thereby reducing manufacturing issues related to planarization, topography, dishing, etc. In one aspect, the conductive and insulative layers of material remain substantially intact in the periphery region, and contacts extend through the layers. In one example, a conductive structure can include an interconnect and a plurality of conductive layers overlying the interconnect. Each conductive layer can be separated from an adjacent conductive layer by an insulative layer. In addition, the conductive structure can include a contact extending through the plurality of conductive layers to the interconnect. The contact can be electrically coupled to the interconnect and insulated from the plurality of conductive layers. Associated systems and methods are also disclosed.

Referring to FIG. 1, a schematic block diagram of an exemplary electronic system 101 is illustrated. The electronic system 101 can be, for example, a non-volatile memory device, such as a solid state memory device (e.g., a memory device such as a three-dimensional NAND memory device). The electronic system 101 can include one or more conductive structures 100 and one or more semiconductor devices 102 (e.g., a plurality of memory cells, a CMOS device, etc.). For example, the electronic system 101 may include one or more conductive structures 100 directly or indirectly connected to and in communication with (e.g., in electrical communication with, in direct or indirect contact with) one or more semiconductor devices 102. It is noted that while conductive structures described herein may make specific reference to use with a NAND device, the disclosure is not so limited and may be applied to other semiconductor and memory devices.

Figure 2:
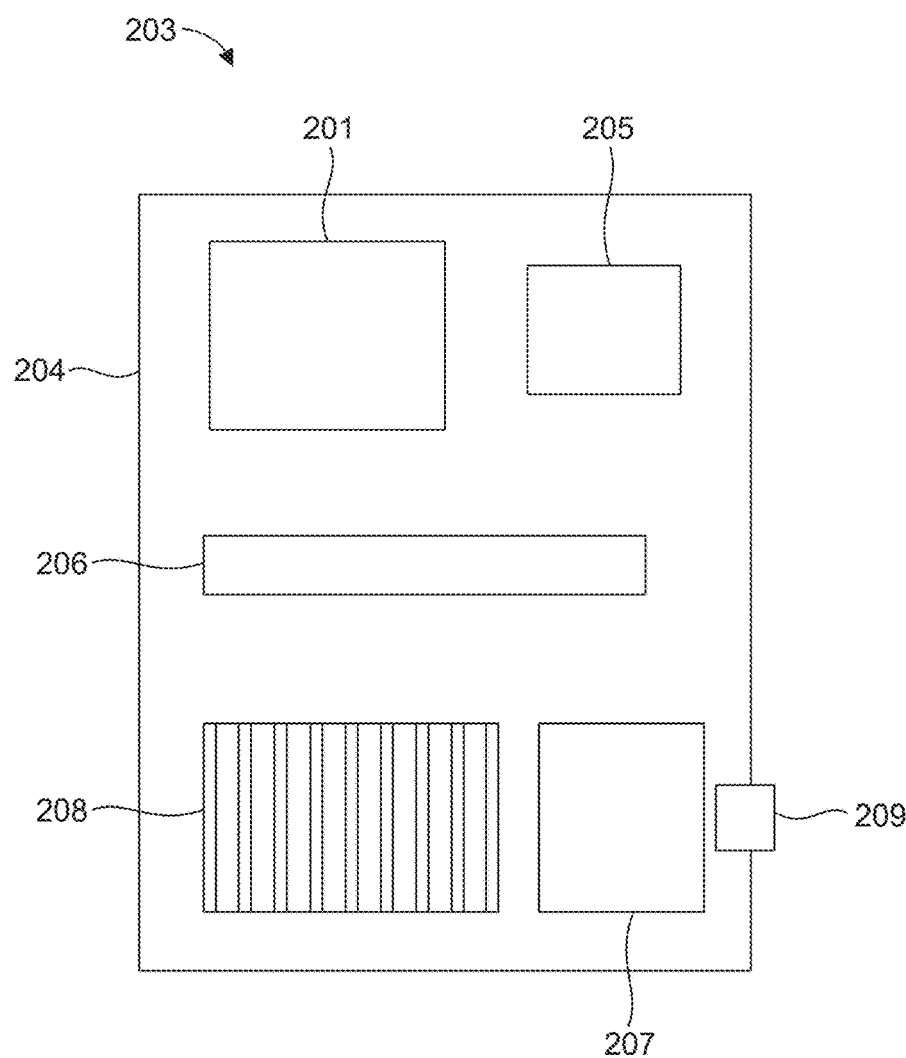
FIG. 2 is a schematic illustration of an exemplary computing system.

FIG. 2 illustrates an example computing system 203 that can include an electronic system 201 (e.g., a solid state memory device) as disclosed herein. The electronic system 201 can be coupled to a motherboard 204. In one aspect, the computing system 203 can also include a processor 205, a memory device 206, a radio 207, a heat sink 208, a port 209, a slot, or any other suitable device or component, which can be operably coupled to the motherboard 204. The computing system 203 can comprise any type of computing system, such as a desktop computer, a laptop computer, a tablet computer, a smartphone, a wearable device, a server, etc. Other embodiments need not include all of the features specified in FIG. 2, and may include alternative features not specified in FIG. 2.

Figure 3:
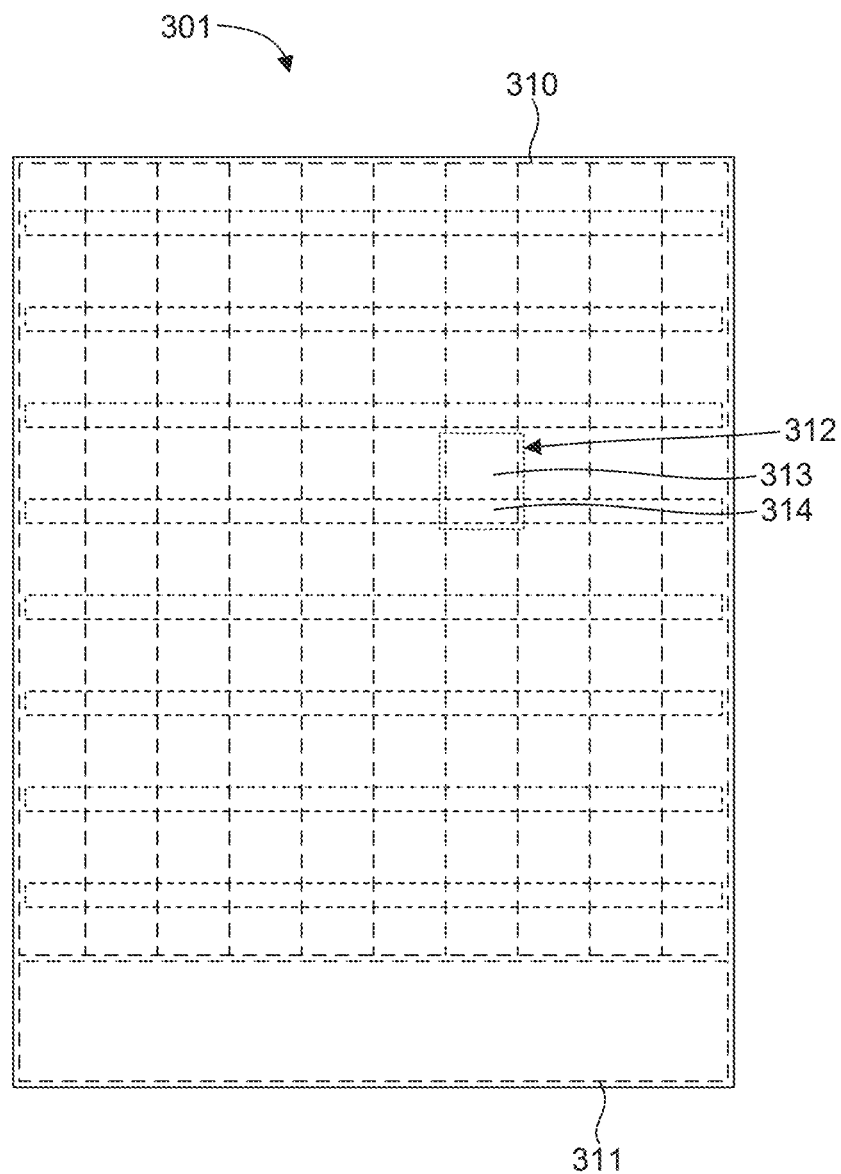
FIG. 3 illustrates a general layout of an electronic system in accordance with an example.

An example of a general layout or arrangement of an electronic system 301 is illustrated in FIG. 3. In this case, the electronic system 301 is configured as a solid state memory component. This plan view shows a memory array region (i.e., a general or global memory array region indicated generally at 310) and a periphery (i.e., a global periphery portion or region indicated generally at 311). The general memory array region 310 is subdivided or segmented into blocks of memory arrays, with each block having a local or block memory array and a staircase. A staircase facilitates electrical connections to word lines connected to memory cells in a local or block memory array. For example, a typical memory block 312 includes a local or block memory array portion or region 313 and a staircase portion or region 314.

Figure 4:
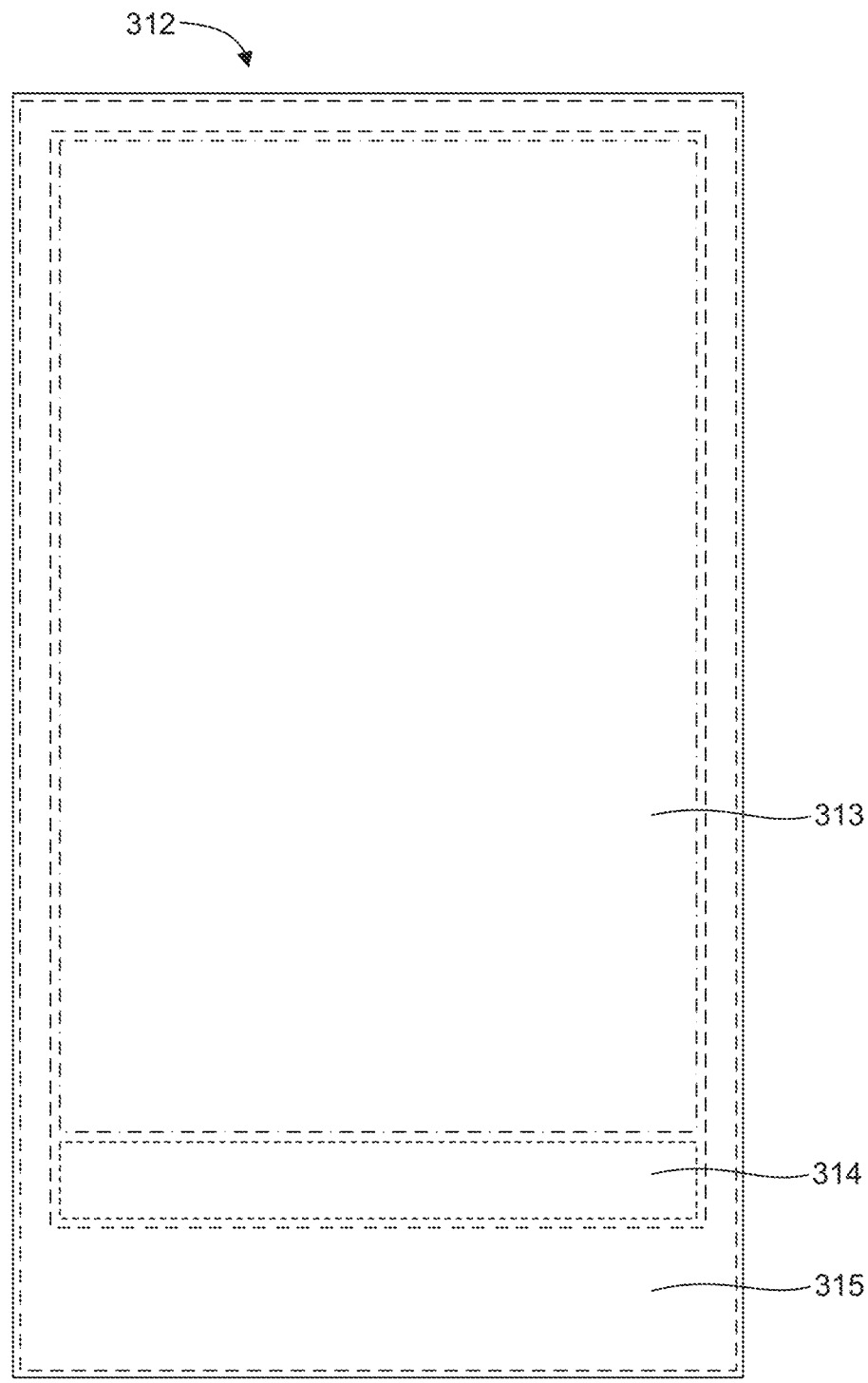
FIG. 4 illustrates a general layout of a memory block of the electronic system of FIG. 3 in accordance with an example.

The general layout or arrangement of the memory block 312 is shown in FIG. 4. This figure shows the memory array portion 313 and the staircase portion 314 in more detail. In addition, FIG. 4 shows a local or block periphery portion 315 about the memory array portion 313 and the staircase portion 314. The local or block periphery portion 315 between memory blocks may provide room for CMOS connections and routing. Conductive structures in accordance with the present disclosure may typically be located in a periphery region of the solid state memory component, such as in the global periphery portion 311 and/or in the local periphery portion 315.

Figure 5:
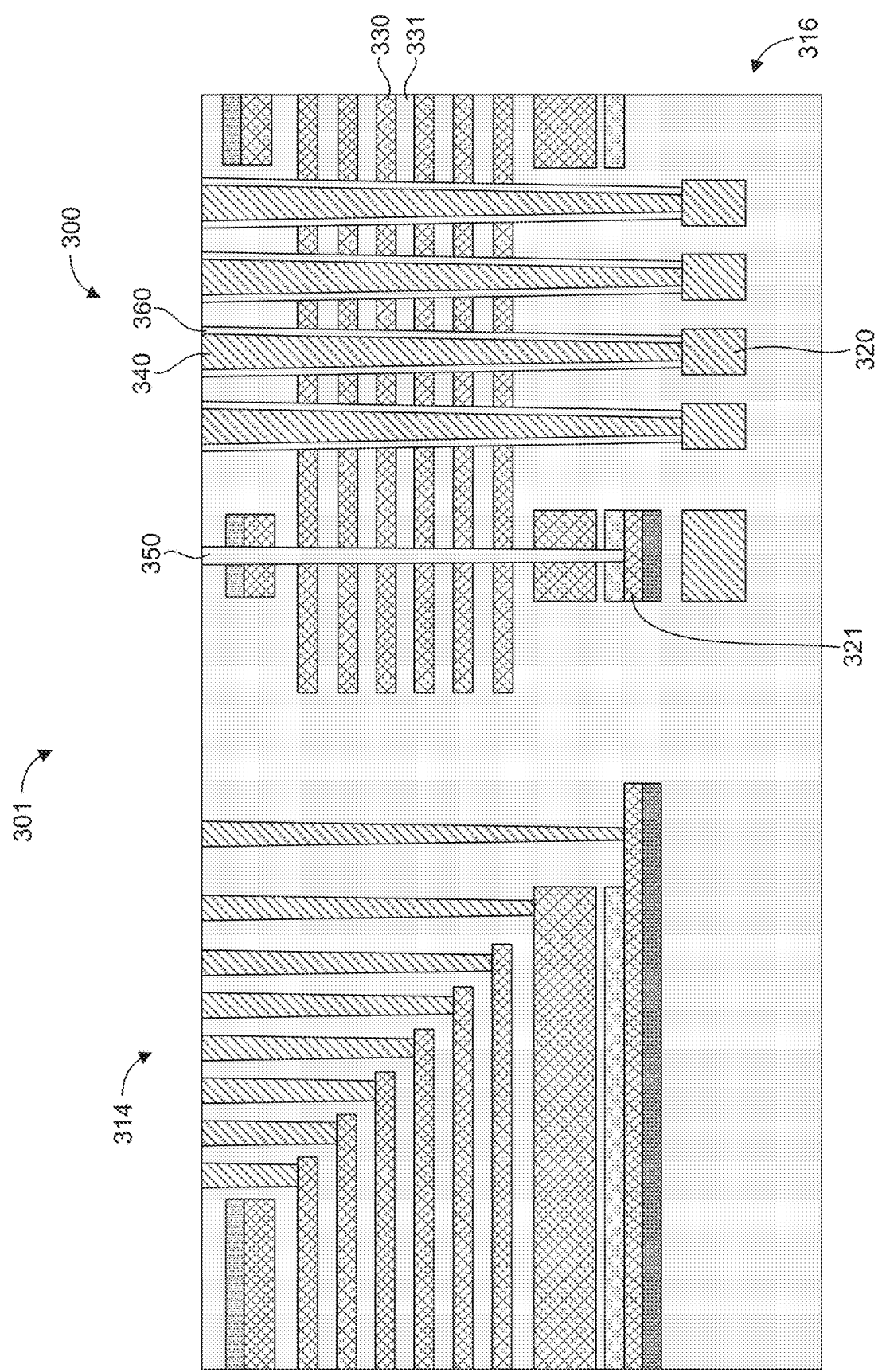
FIG. 5 illustrates a simplified cross-section of a portion of the electronic system of FIG. 3 in accordance with an example.

FIG. 5 is a simplified cross-section illustrating of a portion of the electronic system 301. The electronic system 301 can include a conductive structure 300 in accordance with an example of the present disclosure, which can be electrically coupled to a semiconductor device (not shown), such as a memory cell, a CMOS device, etc. The conductive structure 300 can be in the periphery region or portion of the solid state memory component. A staircase is illustrated for context, which can be located in the staircase portion or region 314.

The conductive structure 300 can include one or more interconnects 320 to electrically couple the conductive structure 300 to a semiconductor device, such as memory cells in the memory array portion 313, a CMOS device, etc. The interconnect 320 may be formed from any suitable conductive material such as, for example, a metal (e.g., W, Ni, tantalum nitride (TaN), Pt, tungsten nitride (WN), Au, titanium nitride (TiN), or titanium aluminum nitride (TiAlN)), polysilicon, other conductive materials, or combinations thereof.

The conductive structure 300 can also include multiple conductive layers 330 overlying the interconnects 320. The conductive layers can be formed from any suitable conductive material, such as polysilicon, tungsten, nickel, titanium, platinum, aluminum, gold, tungsten nitride, tantalum nitride, titanium nitride, other conductive materials, or combinations thereof. Each conductive layer can be separated from an adjacent conductive layer by an insulative layer 331. The insulative layers can be formed from any suitable insulative material, such as an oxide material, a nitride material, other insulative materials, or combinations thereof. The conductive and insulative layers in a periphery can be artifacts remaining from the formation of other features, such as memory cell structures in a memory array region. In some embodiments, one or more of the conductive layers can be electrically coupled to ground.

In addition, the conductive structure 300 can include one or more contacts 340 extending through the conductive layers 330 to, or terminating at, the respective interconnects 320, such as to electrically couple with the interconnects to provide circuitry for operation of the electronic system 301 (e.g., power, ground, and/or signal connections with the interconnects). Each of the contacts 340 will typically be electrically coupled to a different interconnect 320, although such an arrangement is not necessary in every case. In some embodiments, the contacts 320 can be located in a periphery portion of the electronic system 301, and the conductive structure 300 can be electrically coupled to a semiconductor device (e.g., memory cells, a CMOS device, etc.) in the memory array portion 313 via the interconnects 340. The contacts 340 can have any suitable configuration. Typically, the contacts will have a column or elongated configuration.

In addition to extending through the conductive and insulative layers, the contacts may extend through various other materials that may be utilized in or associated with a conductive structure. In one aspect, the conductive structure 300 may include a substrate (indicated generally at 316) or substrate materials that can include any structure that has a semiconductor type material including, for example, silicon, germanium, gallium arsenide, indium phosphide, and other III-V or II-VI type semiconductor materials. Substrates may include, for example, not only conventional substrates but also other bulk semiconductor substrates such as, by way of example and not limitation, silicon-on-insulator (SOI) type substrates, silicon-on-sapphire (SOS) type substrates, doped and undoped silicon, doped and undoped semiconductors, and epitaxial layers of silicon supported by another material. In some embodiments, a substrate may include any structure that the conductive structure 300 may be formed over or on including, for example, other portions of an electronic system or semiconductor device 102 (FIG. 1).

Figure 6:
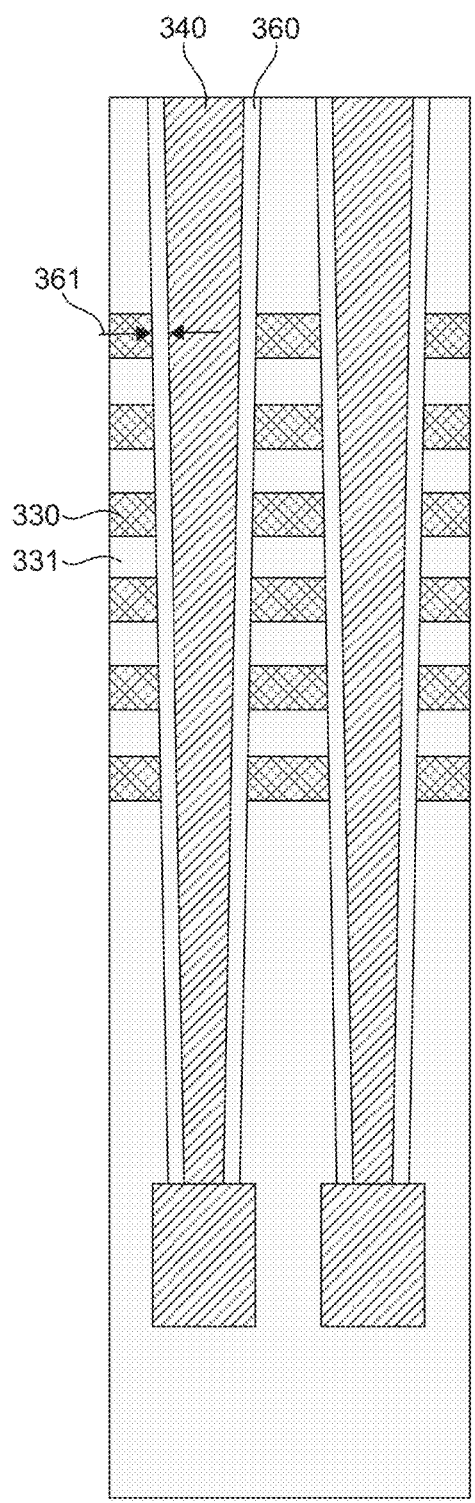
FIG. 6 is a detail view of a conductive structure of the electronic system of FIG. 5.

The contacts 340 can be electrically insulated or isolated from the conductive layers 330 to avoid capacitance and shorting (i.e., electrical leakage). In one aspect, the contacts 340 can be separated from the conductive layers 330 by insulative material. For example, insulative liners 360 can be disposed about the contacts 340 between the contacts and the conductive and insulative layers 330, 331 to insulate the contacts from the conductive layers. The insulative liners 360 can have any suitable thickness. In one aspect, as illustrated in FIG. 6, the insulative liners 360 can have a thickness 361 of at least about 5 nm between the contacts 340 and the conductive layer 330 material. The insulative liners 360 can be formed from any suitable insulative material, such as an oxide material, a nitride material, other insulative materials, or combinations thereof. The insulative liners 360 can contribute to separating and insulating the contacts 340 and the conductive layers 330 by a suitable distance.

Figure 7:
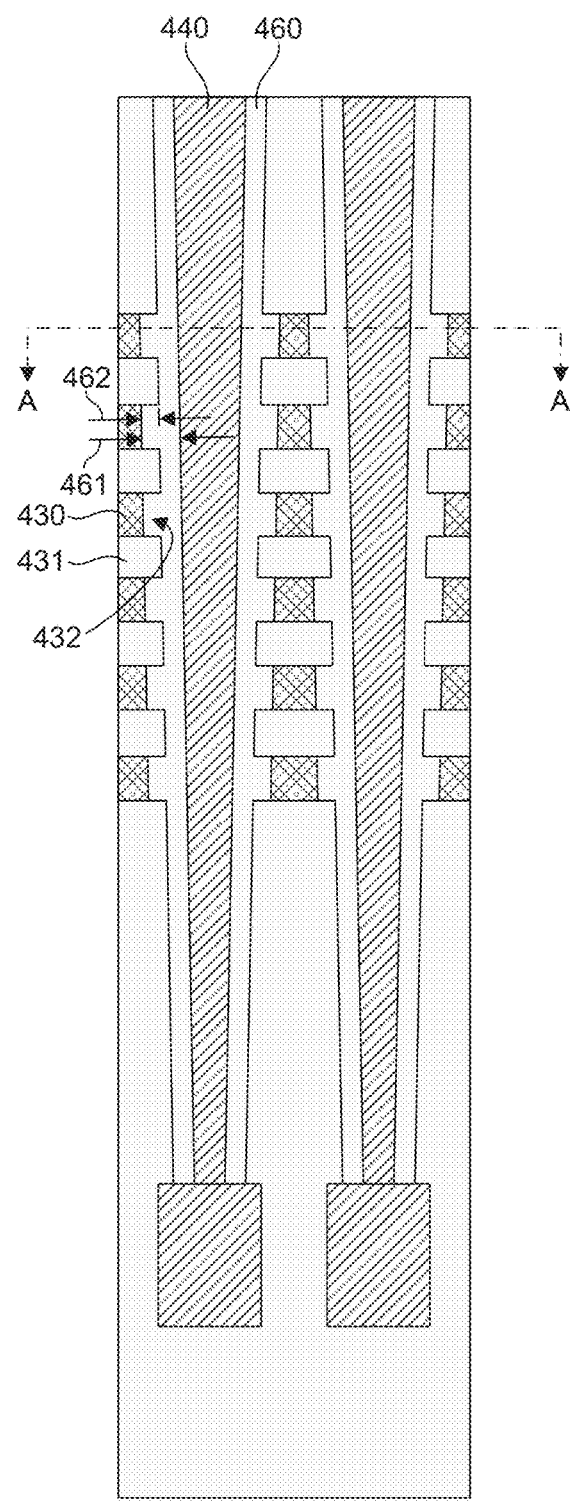
FIG. 7 is a detail view of a conductive structure in accordance with an example.
Figure 8:
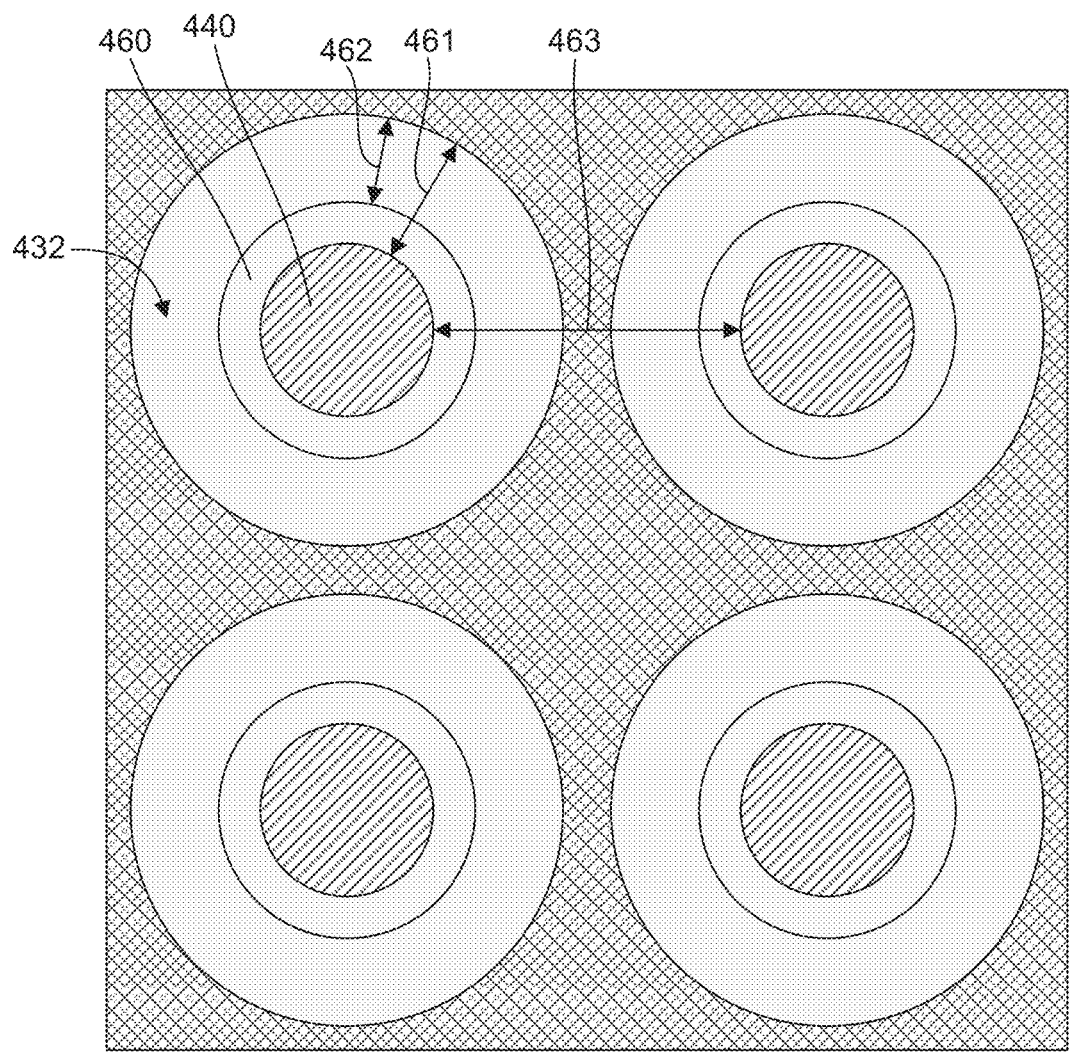
FIG. 8 is a top cross-sectional view of the conductive structure of FIG. 7.

In some embodiments, illustrated in the side view of FIG. 7 and the top view of FIG. 8, conductive layers 430 can be recessed proximate contacts 440 such that material of insulative layers 431 is closer to the contacts 440 than the material of the conductive layers 430. Such recesses 432 in the conductive layers 430 can be filled with insulative material, such as that of an insulative liner 460. Recesses can be included if additional isolation from the contacts 440 is desired. The recesses 432 can be of any suitable depth 462, but may be limited in a practical sense by structural considerations during manufacture, such as maintaining sufficient conductive layer material to prevent collapse of the structure. The contacts 440 and the material of the conductive layers 430 can be separated by a distance 461 of from about 5 nm to about 75 nm, which can be equal to a thickness of the insulative liners 460 between the contacts 440 and the conductive layer 430 material. Adjacent contacts can also be electrically insulated or isolated from one another to avoid capacitance and shorting (i.e., electrical leakage). Such electrical isolation can be accomplished at least in part by separating adjacent contacts by a distance 463 of at least about 200 nm in some embodiments. In general, it is desirable to minimize capacitor coupling as much as possible. Electrical isolation can be achieved when capacitance between adjacent contacts and between contacts and conductive layer material is acceptable for a given circuit.

Figure 9:
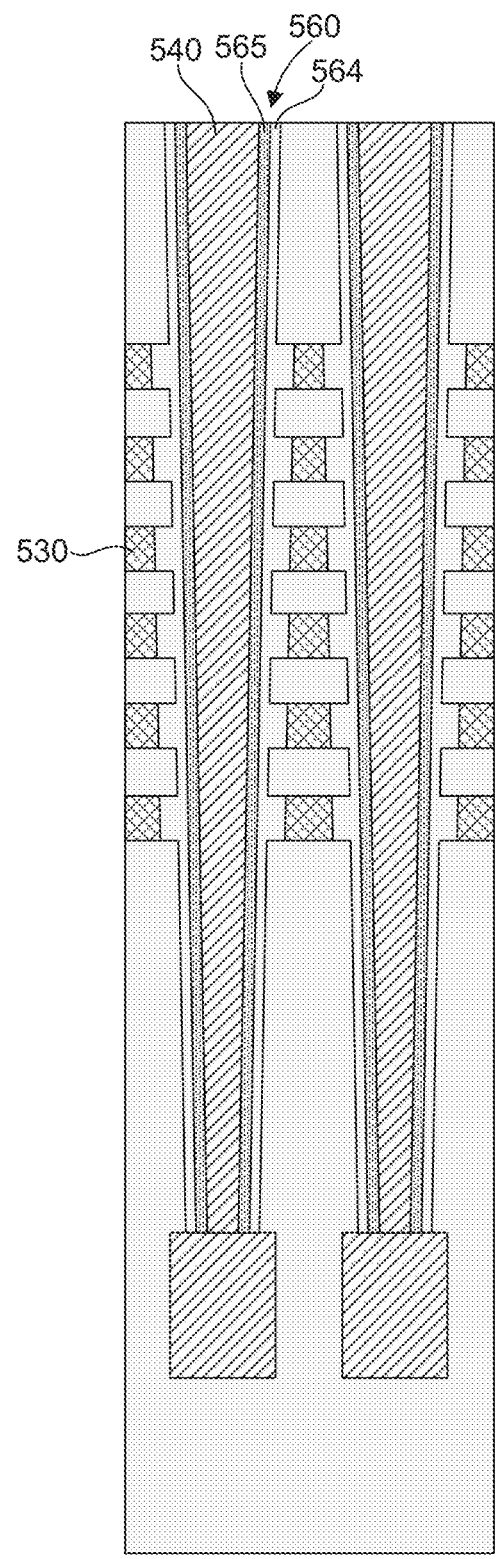
FIG. 9 is a detail view of a conductive structure in accordance with an example.

In some embodiments, illustrated in FIG. 9, insulative liners 560 between contacts 540 and conductive layers 530 can have multiple layers 564, 565, such as an oxide layer and a nitride layer. The oxide material layer can be an outer layer 564 and the nitride material layer can be an inner layer 565 relative to the contacts. The nitride layer can improve isolation performance over a single oxide liner layer. The oxide and nitride layers can be of any suitable thickness. In one aspect, the oxide outer layer 564 can be from about 40 nm to about 150 nm thick or thicker between the contacts 540 and the conductive layer 530 material. In another aspect, the nitride inner layer 565 can be from about 3 nm to about 10 nm thick between the contacts 540 and the conductive layer 530 material. Multilayer insulative liners can be incorporated in embodiments with recessed conductive layers (as illustrated), or in embodiments that do not have recessed conductive layers. Moreover, it should be understood that any combination of insulative materials in any number of layers, with amounts of thickness can be used to achieve a desired result.

With further reference to FIG. 5, the conductive structure 300 can optionally include a barrier 350 extending through the conductive layers 330. The barrier 350 can have any suitable configuration. Typically, the barrier 350 will have a wall configuration. In some embodiments, the barrier 350 can be formed from any suitable insulative material, such as an oxide material, a nitride material, other insulative materials, or combinations thereof. In other embodiments, the barrier 350 can be formed of any suitable conductive material (e.g., polysilicon, tungsten, nickel, titanium, platinum, aluminum, gold, tungsten nitride, tantalum nitride, titanium nitride), which can be in contact with one or more of the conductive layers 330 to form a grounding wall that grounds one or more of the conductive layers 330 in the periphery. In this case, the barrier 350 can terminate or be in contact with a suitable conductive component, such as an interconnect 321, which can be coupled to ground.

Figure 10B:
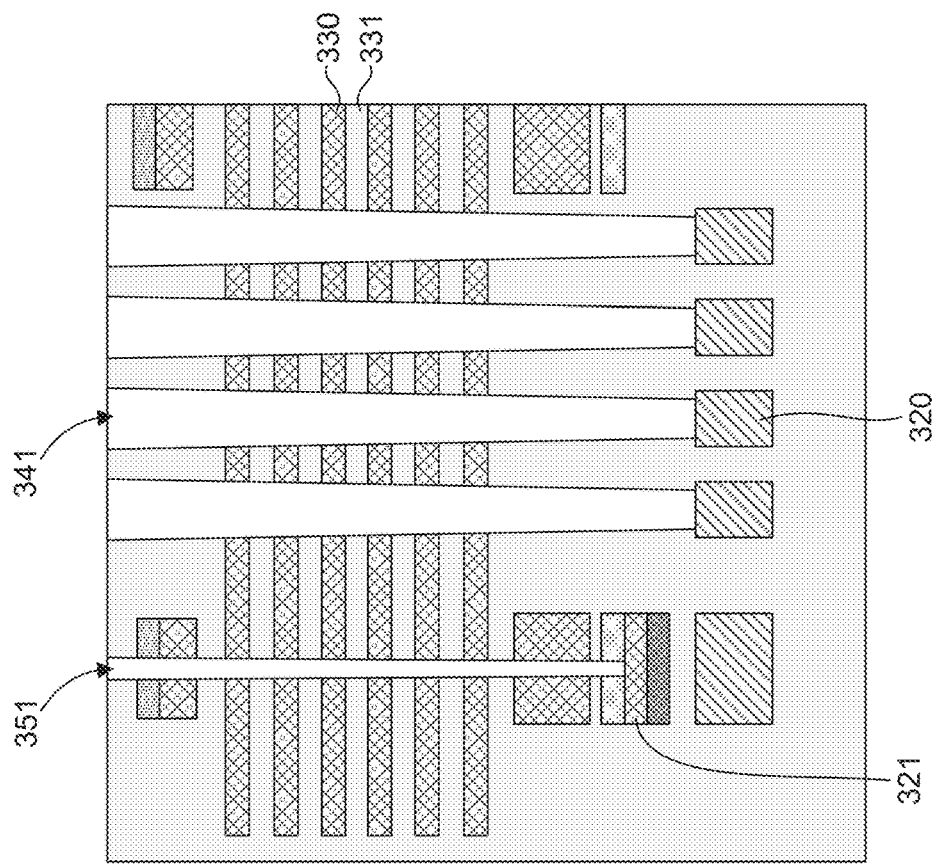
FIGS. 10A-10D illustrate a method for making the electronic system of FIG. 5 in accordance with an example.
Figure 10A:
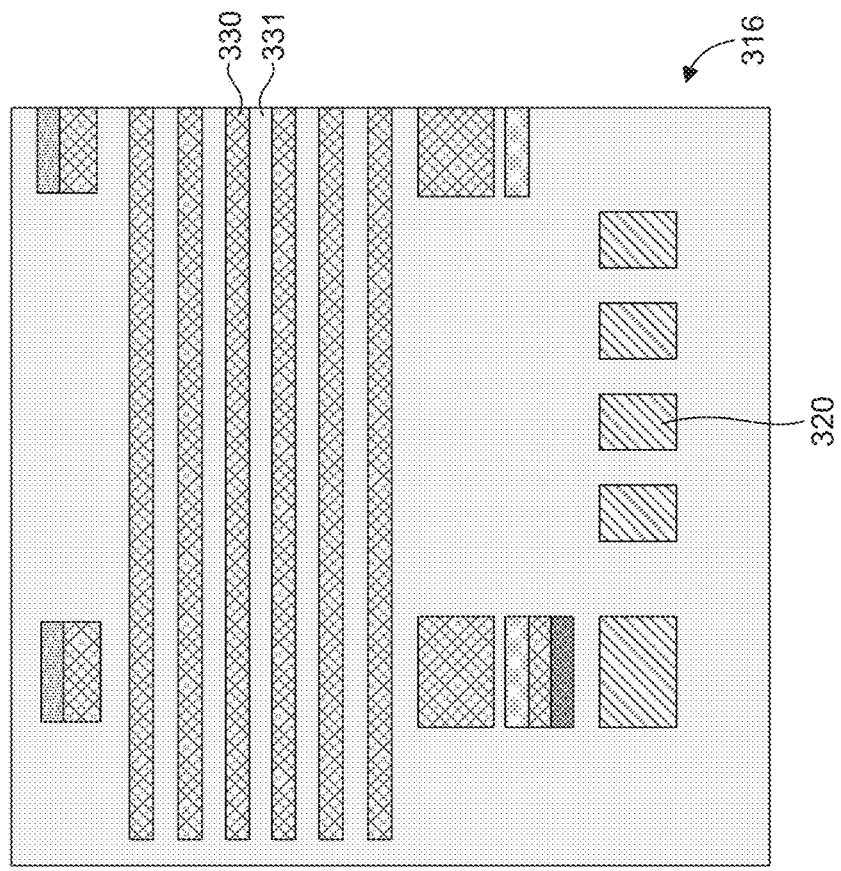

FIGS. 10A-10D illustrate aspects of exemplary methods or processes for making an electronic system, such as the electronic system 301 of FIG. 5, which includes aspects of making the conductive structure 300 and the barrier 350. FIG. 10A schematically illustrates a side cross-sectional view of the conductive layers 330 and the insulative layers 331, which are located over the interconnects 320. Alternating conductive layers 330 and insulating layers 331 may be formed over a substrate 316 by conventional methods. The substrate over which the conductive layers 330 and insulating layers 331 are formed may be any substantially planar material. By way of non-limiting example, the substrate may be a semiconductor material and may include at least portions of circuits to which transistors of a memory array may be connected. Each conductive layer 330 may be used to form a conductive connection (e.g., word line connection, control gate) in the memory array, although the disclosure is not so limited. Each conductive layer 330 may, for example, be a substantially planar conductive layer. The barrier 350 can separate conductive layer portions in the periphery from conductive layer portions in the memory array and/or staircase region. Generally, the conductive layer portions referred to herein are in the periphery unless otherwise specified.

In one aspect, one or more of the conductive layers 330 can be electrically coupled to ground. The interconnects 320 can be electrically coupled to a semiconductor device (not shown). Thus, it may be desirable to form electrical connections or contacts with the interconnects 320 to provide communication with the semiconductor device. As shown in FIG. 10B, contact openings 341 can be formed through the conductive layers 330 and the insulative layers 331. The contact openings 341 can extend to the interconnects 320 underlying the conductive and insulative layers 330, 331. The contact openings 341 can be formed by any suitable process or technique, such as by etching. Each of the contact openings 341 can have an elongated configuration, as desired, which can be a general shape of the contacts to be formed in the contact openings. In one aspect, a slot or trench 351 can be formed that extends through the conductive and insulative layers 330, 331 to create a barrier. The slot or trench 351 can terminate or land on a suitable component, such as a conductive material (e.g., an interconnect 321) or an insulative material. The contact openings 341 and the slot 351 can be formed in separate process steps or formed simultaneously in the same process step.

Figure 10D:
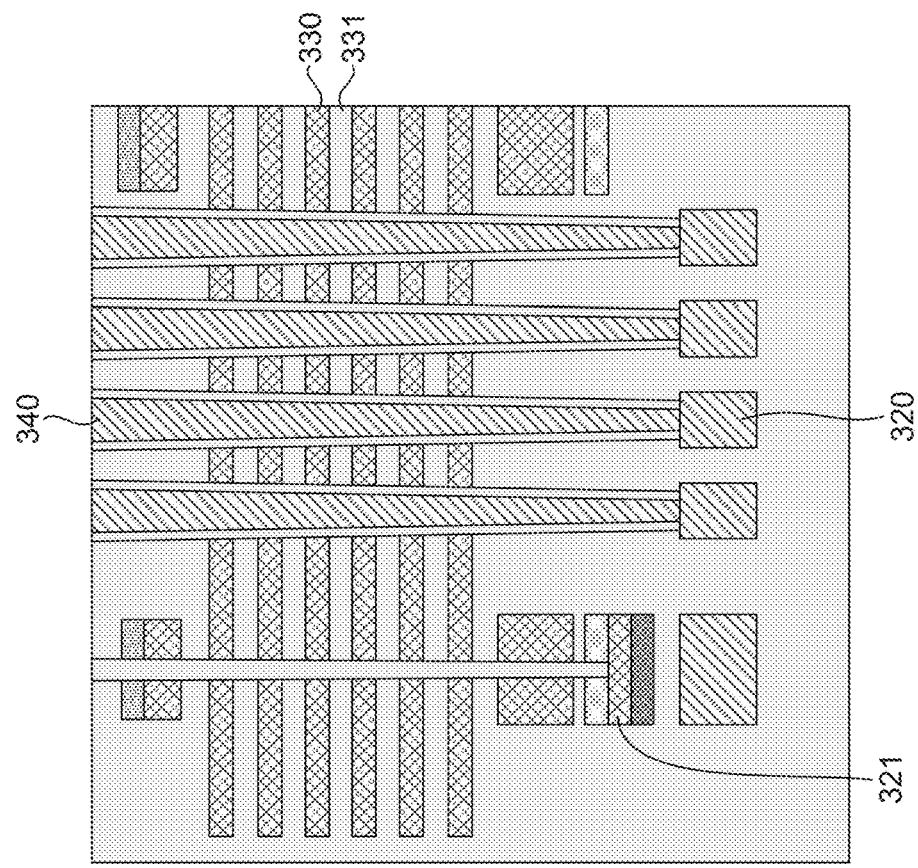
Figure 10C:
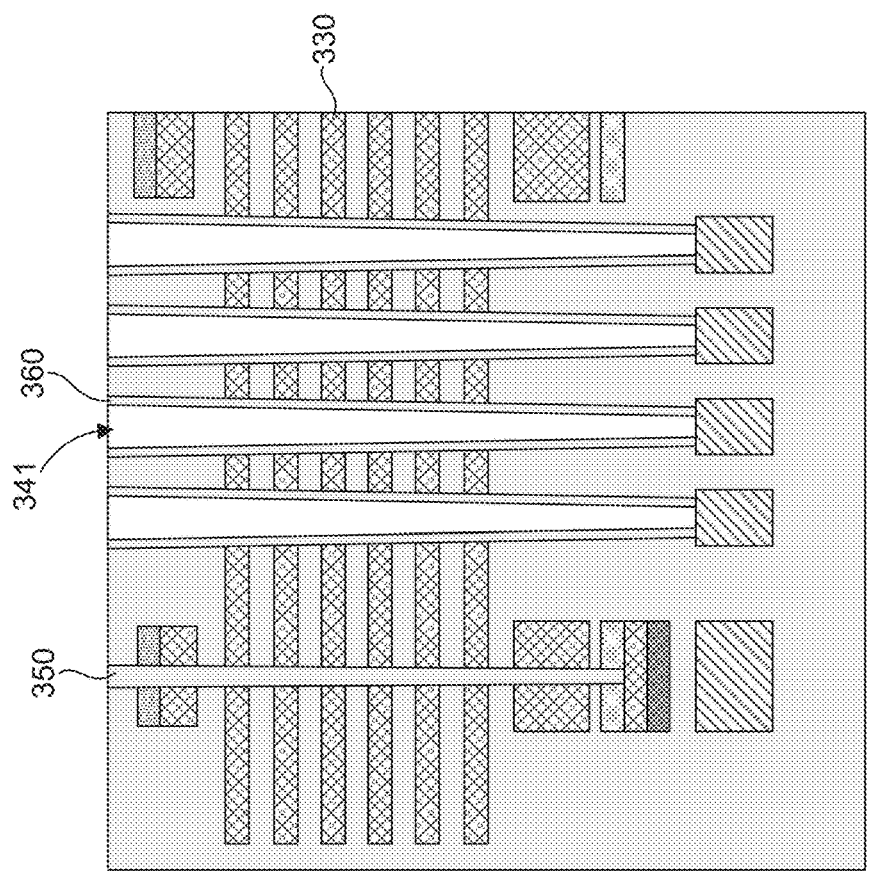

The contacts that will be formed in the contact openings 341 can be insulated from the conductive layers 330 by forming insulative liners 360 in the contact openings 341, as shown in FIG. 10C. The insulative liners 360 can be formed by any suitable process or technique, such as by a deposition process. In some embodiments, the barrier can be formed by disposing insulative material in the slot or trench 351. In some cases, the insulative material can fill a width of the slot or trench 351, thus substantially filling the slot or trench 351 with insulative material to form the barrier 350. The insulative material forming the barrier 350 can be disposed in the slot or trench 351 by any suitable process or technique, such as by a deposition process. In one aspect, the insulative liners 360 can be formed in the contact openings 341 at the same time that insulative material is disposed in the slot or trench 351 to form the barrier 350. Thus, the insulative liners 360 and the barrier 350 can be formed in the same process or processes, which can result in a cost savings over utilizing separate processes.

As shown in FIG. 10D, contacts 340 can be formed in the contact openings 341 electrically coupled to the interconnects 320. With the insulative liners 360 in the contact openings 341 prior to formation of the contacts 340, the insulative liners are disposed about the contacts 340 between the contacts and the conductive and insulative layers 330, 331 to insulate the contacts from the conductive layers. The contacts 340 can be formed by any suitable process or technique, such as by a deposition process. In some embodiments (not illustrated here), the barrier can be formed by disposing conductive material in the slot or trench 351, which can be in contact with one or more of the conductive layers 330 to form a grounding wall that grounds one or more of the conductive layers 330. In some cases, the conductive material can fill a width of the slot or trench 351, thus substantially filling the slot or trench 351 with conductive material to form the barrier 350. The conductive material forming the barrier 350 can be disposed in the slot or trench 351 by any suitable process or technique, such as by a deposition process. In one aspect, the contacts 340 can be formed in the contact openings 341 at the same time that conductive material is disposed in the slot or trench 351 to form the barrier 350. Thus, the contacts 340 and the barrier 350 can be formed in the same process or processes, which can result in a cost savings over utilizing separate processes.

The contacts 340 and other conductive material structures may be formed by, for example, growing, diffusing, depositing, or otherwise providing thereon. The various structures may be formed using, for example, deposition techniques (e.g., chemical vapor deposition (CVD), physical vapor deposition (PVD), atomic layer deposition (ALD), sputtering, thermal evaporation, or plating), oxidation processes (e.g., thermal oxidation, ISSG oxidation), and patterning techniques (e.g., masking and etching) known in the art of integrated circuit fabrication. The insulative structures (e.g., forming the insulative liners 360 and the barrier 350) may be formed by chemical vapor deposition, by decomposing tetraethyl orthosilicate (TEOS), or by any other process known in the art of integrated circuit fabrication. Additionally, the materials or portions thereof may be removed using, for example, an abrasion or polishing process (e.g., a chemical-mechanical planarization (CMP) process, a chemical polishing process, a mechanical planarization process), an etching process, a lift-off process, or a combination thereof. Etching processes may include, for example, wet or dry etching such as removing portions of a material using a mask and an anisotropic etching process (e.g., a reactive ion etching process, such as using a plasma) or removing portions of a material using a mask and an isotropic process (e.g., a chemical etching process). It is noted that the particular composition of the gases used to generate the reactive ions, the particular composition of the chemical etchant, and the operating parameters of the etching process may be selected based on the composition of the mask, the material to be etched, and the surrounding materials.

Figure 11A:
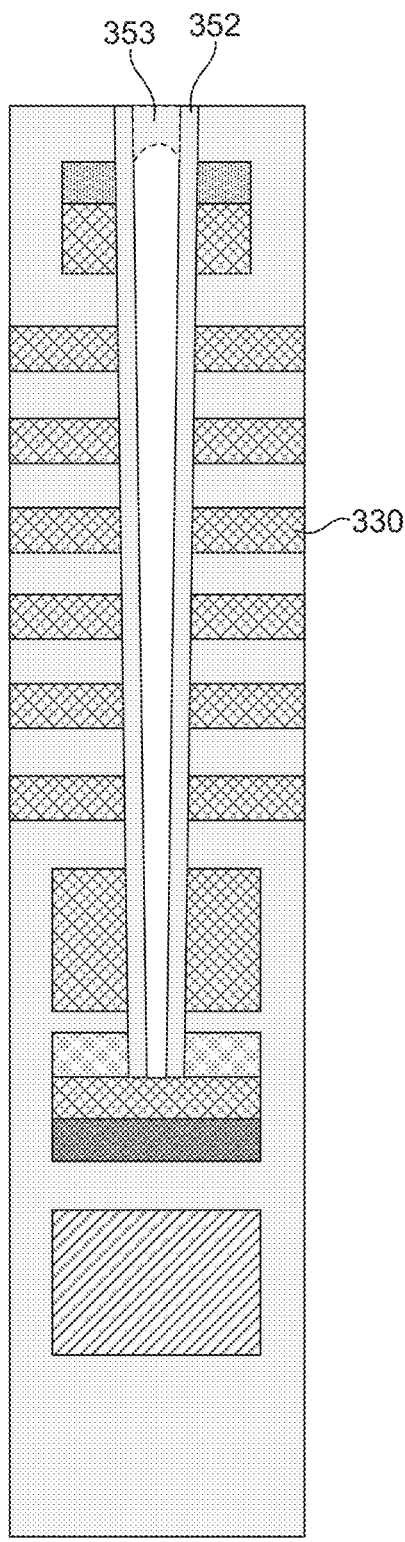
FIG. 11A is a detail view of a barrier of an electronic system in accordance with an example.
Figure 11B:
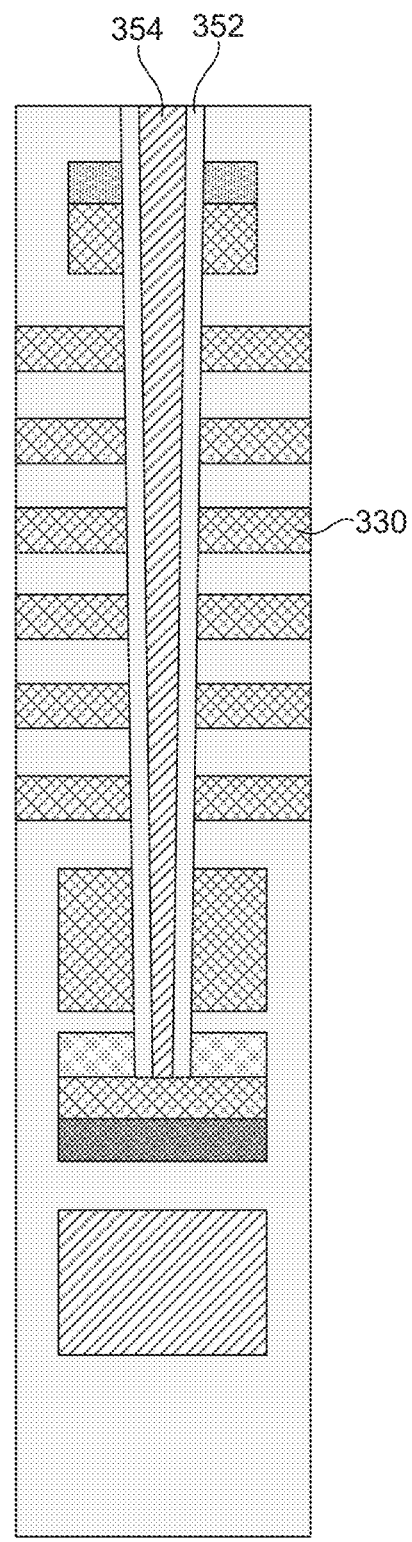
FIG. 11B is a detail view of a barrier of an electronic system in accordance with another example.

In some barrier embodiments, insulative material 352 disposed in the slot or trench may form a layer proximate the conductive layers 330 that fills less than the width of the slot or trench, as shown in FIGS. 11A and 11B. In some cases, the insulative material 352 may be deposited on the side walls of the slot or trench and cover a top of the slot or trench, as illustrated in FIG. 11A. For example, the slot or entrance to the slot may be sized to have a width that enables insulative material deposited in the slot to pinch-off within the entrance of the slot, thus plugging the entrance to the slot with insulative material 353 such that no additional material can be deposited in the slot. It is noted that the width of the slot entrance enabling the material to pinch-off therein will vary based at least partially on the material used to fill the slot and the technique used to deposit the material. In other cases, the insulative material 352 may be deposited on the side walls of the slot or trench while leaving the top open. In other words, the width of the slot or slot entrance can be such that material does not pinch off the entrance. In such cases, the slot or trench is open and may also be filled with conductive material 354, as illustrated in FIG. 11B, which may be deposited at the same time that contacts are formed in the contact openings. Thus, the barrier can include conductive material at least partially surrounded by a layer of insulative material that electrically isolates the conductive material of the barrier from the conductive layers. In some embodiments, the conductive material can be removed from the slot, if desired.

Figure 12C:
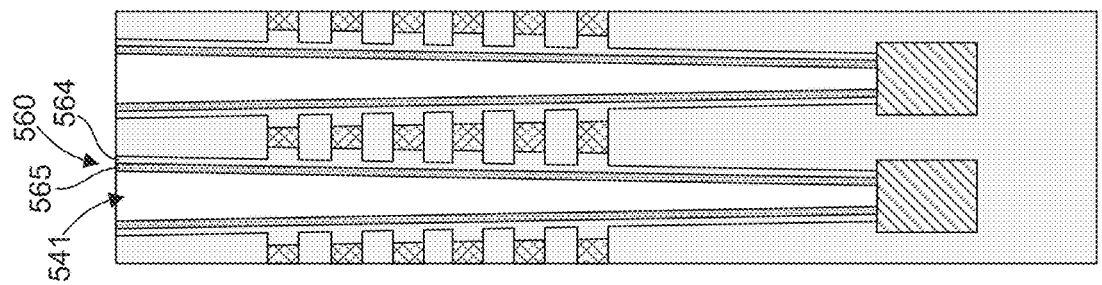
FIGS. 12A-12C illustrate a method for making conductive structures in accordance with an example.
Figure 12B:
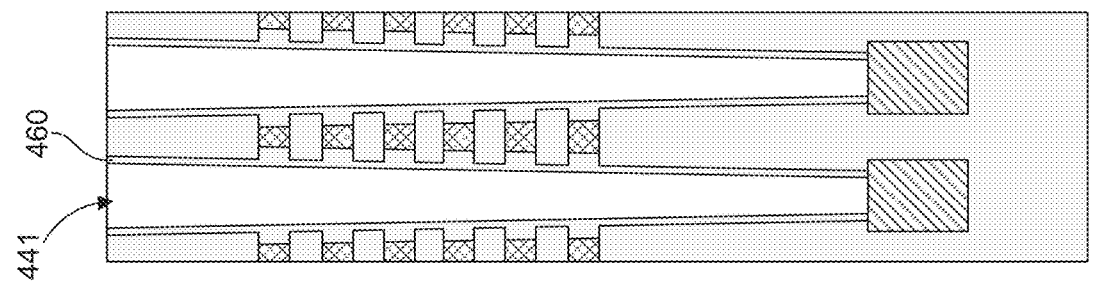
Figure 12A:
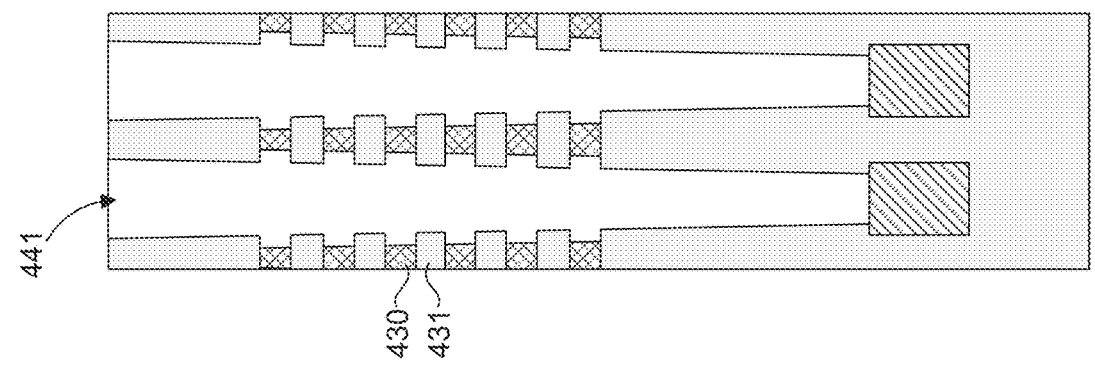

FIGS. 12A-12C illustrate further aspects of exemplary methods or processes for making the conductive structure of an electronic system. FIG. 12A schematically illustrates a side cross-sectional view of conductive layers 430 and the insulative layers 431, where the conductive layers have been recessed as in the embodiments illustrated in FIGS. 7-9. In particular, the material of the conductive layers 430 proximate the contact openings 441 can be recessed such that the insulative layer 431 material will be closer to a contact formed in the contact opening than the conductive layer 430 material. The conductive layer 430 material can be recessed by any suitable process or technique, such as etching. FIG. 12B illustrates insulative material disposed in the contact openings 441 to form an insulative liner 460. In some embodiments, conductive material can be disposed in the contact openings 441 to form the contacts 440 as shown in FIGS. 7 and 8. Alternatively, as shown in FIG. 12C, an additional inner layer 565 of insulative material (e.g., a nitride layer) can be formed or deposited in the contact opening 541 over the outer layer 564 of insulative material (e.g., an oxide layer) to form the multilayer insulative liner 560 of the embodiment illustrated in FIG. 9. Conductive material can then be disposed in the contact openings 541 to form the contacts 540.

Figure 14:
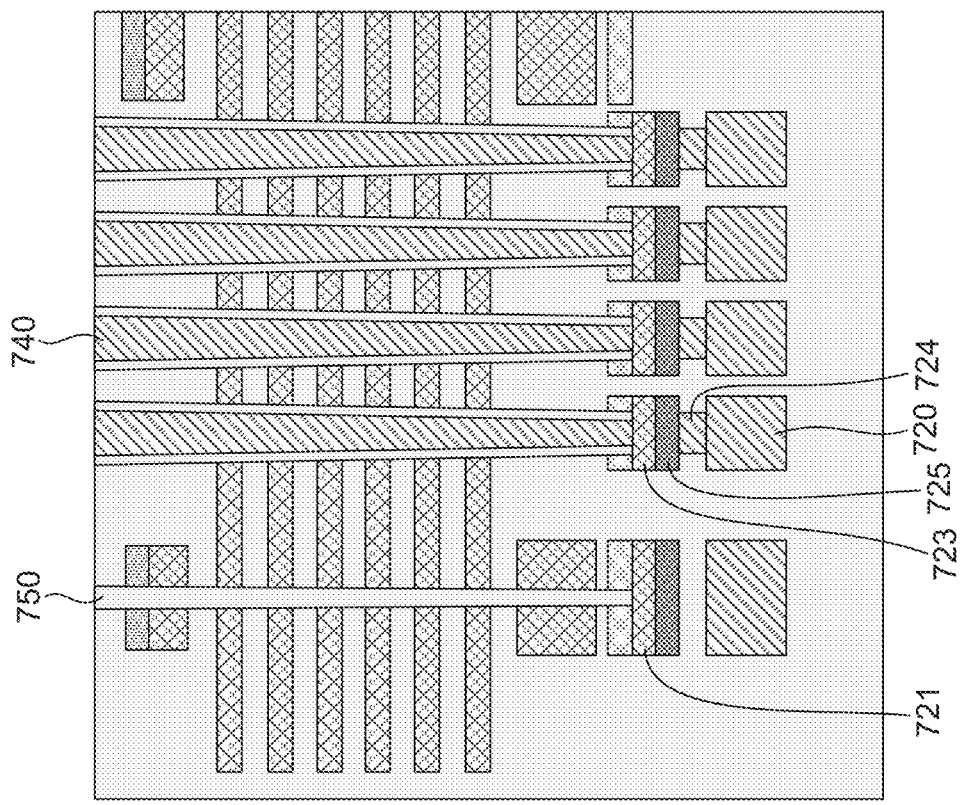
FIG. 14 illustrates an electronic system in accordance with another example.
Figure 13:
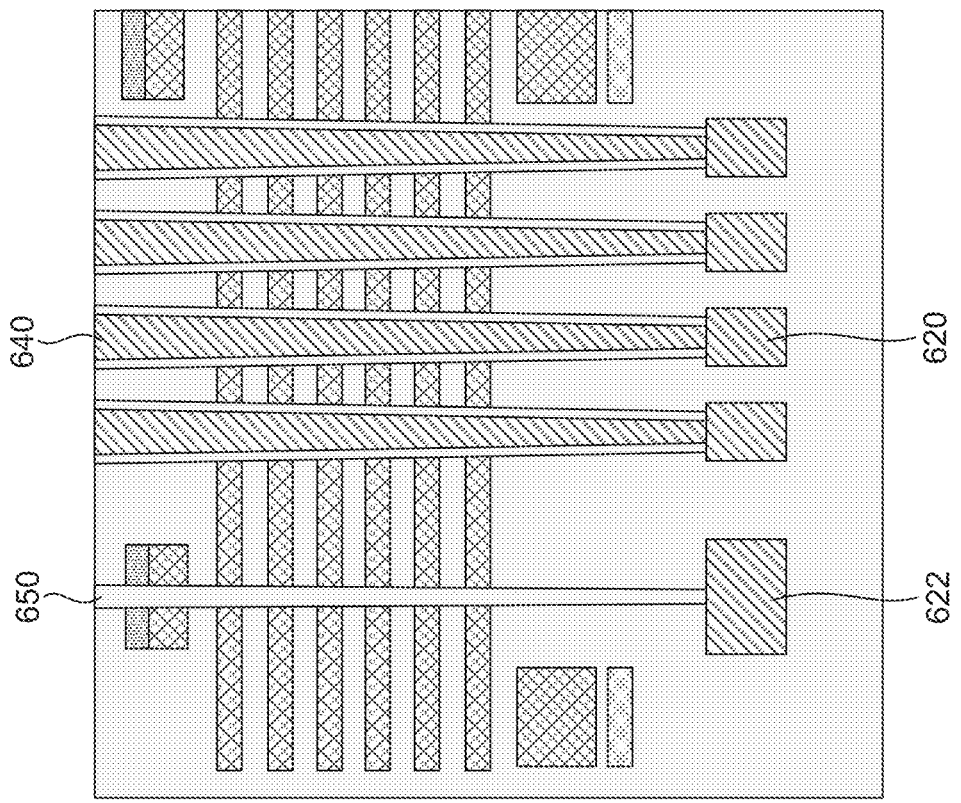
FIG. 13 illustrates an electronic system in accordance with an example.

FIGS. 13 and 14 illustrate electronic systems with variations for interconnects associated with contacts and barriers. FIG. 13 shows a barrier 650 terminating at, or landing on, an interconnect 622 that is at the same "level" as interconnects 620 that are electrically coupled to contacts 640. In this case, the barrier terminates at, or lands on, a conductive structure that is at a lower level than the interconnects in the previous examples. FIG. 14 shows contacts 740 terminating at, or landing on, conductive lands 723 that are at the same "level" as an interconnect 721 upon which a barrier 750 terminates or lands. In this case, the contacts terminate at, or land on, a conductive structure that is at a higher level than, or above, interconnects 720. The conductive lands 723 can be coupled to the interconnects 720 via one or more intermediate conductive structures 724, 725. Thus, the circuit design and manufacturing processes can be adjusted to land contacts and/or barriers on any suitable routing layer or other landing pad.

Examples

The following examples pertain to further embodiments.

In one example there is provided, a conductive structure comprising an interconnect, a plurality of conductive layers overlying the interconnect, each conductive layer being separated from an adjacent conductive layer by an insulative layer, and a contact extending through the plurality of conductive layers to the interconnect, wherein the contact is electrically coupled to the interconnect and insulated from the plurality of conductive layers.

In one example of a conductive structure, the contact comprises a plurality of contacts.

In one example of a conductive structure, adjacent contacts of the plurality of contacts are electrically isolated from one another.

In one example of a conductive structure, adjacent contacts of the plurality of contacts are separated by at least 200 nm.

In one example, a conductive structure comprises insulative liners disposed about the contacts between the contacts and the conductive and insulative layers to insulate the contacts from the conductive layers.

In one example of a conductive structure, the insulative liners are at least about 5 nm thick.

In one example of a conductive structure, the insulative layer material is closer to the contacts than the conductive layer material.

In one example of a conductive structure, the contacts and the conductive layer material are separated by a distance of from about 5 nm to about 75 nm.

In one example of a conductive structure, the insulative liners comprise an oxide material, a nitride material, or a combination thereof.

In one example of a conductive structure, the insulative liners each comprise an oxide material layer and a nitride material layer.

In one example of a conductive structure, the oxide material layer is an outer layer and the nitride material layer is an inner layer relative to the contacts.

In one example of a conductive structure, the interconnect comprises a plurality of interconnects.

In one example of a conductive structure, each of the plurality of contacts is electrically coupled to a different one of the plurality of interconnects.

In one example of a conductive structure, the contact is separated from the plurality of conductive layers by insulative material.

In one example of a conductive structure, the contact comprises a column configuration.

In one example of a conductive structure, at least one of the plurality of conductive layers is electrically coupled to ground.

In one example of a conductive structure, the conductive layers comprise polysilicon, tungsten, nickel, titanium, platinum, aluminum, gold, tungsten nitride, tantalum nitride, titanium nitride, or a combination thereof.

In one example of a conductive structure, the insulative layer comprises an oxide material, a nitride material, or a combination thereof.

In one example there is provided, a solid state memory device comprising a semiconductor device, and a conductive structure electrically coupled to the semiconductor device, the conductive structure having an interconnect, a plurality of conductive layers overlying the interconnect, each conductive layer being separated from an adjacent conductive layer by an insulative layer, and a contact extending through the plurality of conductive layers to the interconnect, wherein the contact is electrically coupled to the interconnect and insulated from the plurality of conductive layers.

In one example of a solid state memory device, the contact is located in a periphery portion of the solid state memory device.

In one example of a solid state memory device, the conductive structure is electrically coupled to the semiconductor device via the interconnect.

In one example of a solid state memory device, the semiconductor device comprises a memory cell, a CMOS device, or a combination thereof.

In one example of a solid state memory device, the contact comprises a plurality of contacts.

In one example of a solid state memory device, adjacent contacts of the plurality of contacts are electrically isolated from one another.

In one example of a solid state memory device, adjacent contacts of the plurality of contacts are separated by at least 200 nm.

In one example, a solid state memory device comprises insulative liners disposed about the contacts between the contacts and the conductive and insulative layers to insulate the contacts from the conductive layers.

In one example of a solid state memory device, the insulative liners are at least about 5 nm thick.

In one example of a solid state memory device, the insulative layer material is closer to the contacts than the conductive layer material.

In one example of a solid state memory device, the contacts and the conductive layer material are separated by a distance of from about 5 nm to about 75 nm.

In one example of a solid state memory device, the insulative liners comprise an oxide material, a nitride material, or a combination thereof.

In one example of a solid state memory device, the insulative liners each comprise an oxide material layer and a nitride material layer.

In one example of a solid state memory device, the oxide material layer is an outer layer and the nitride material layer is an inner layer relative to the contacts.

In one example of a solid state memory device, the interconnect comprises a plurality of interconnects.

In one example of a solid state memory device, each of the plurality of contacts is electrically coupled to a different one of the plurality of interconnects.

In one example of a solid state memory device, the contact is separated from the plurality of conductive layers by insulative material.

In one example of a solid state memory device, the contact comprises a column configuration.

In one example of a solid state memory device, at least one of the plurality of conductive layers is electrically coupled to ground.

In one example of a solid state memory device, the conductive layers comprise polysilicon, tungsten, nickel, titanium, platinum, aluminum, gold, tungsten nitride, tantalum nitride, titanium nitride, or a combination thereof.

In one example of a solid state memory device, the insulative layer comprises an oxide material, a nitride material, or a combination thereof.

In one example, a solid state memory device comprises a barrier extending through the plurality of conductive layers.

In one example of a solid state memory device, the barrier comprises a wall configuration.

In one example of a solid state memory device, the barrier comprises a layer of insulative material proximate the conductive layers.

In one example of a solid state memory device, the insulative material of the barrier comprises an oxide material, a nitride material, or a combination thereof.

In one example of a solid state memory device, the barrier comprises a conductive material at least partially surrounded by the layer of insulative material that electrically isolates the conductive material of the barrier from the conductive layers.

In one example of a solid state memory device, the conductive material of the barrier comprises polysilicon, tungsten, nickel, titanium, platinum, aluminum, gold, tungsten nitride, tantalum nitride, titanium nitride, or a combination thereof.

In one example, there is provided a computing system comprising a motherboard, and a solid state memory device operably coupled to the motherboard. The a solid state memory device comprises a semiconductor device, and a conductive structure electrically coupled to the semiconductor device, the conductive structure having an interconnect, a plurality of conductive layers overlying the interconnect, each conductive layer being separated from an adjacent conductive layer by an insulative layer, and a contact extending through the plurality of conductive layers to the interconnect, wherein the contact is electrically coupled to the interconnect and insulated from the plurality of conductive layers.

In one example of a computing system, the computing system comprises a desktop computer, a laptop, a tablet, a smartphone, a wearable device, a server, or a combination thereof.

In one example of a computing system, the computing system further comprises a processor, a memory device, a heat sink, a radio, a slot, a port, or a combination thereof operably coupled to the motherboard.

In one example there is provided a method for making a conductive structure comprising forming an opening through a plurality of conductive layers, each conductive layer being separated from an adjacent conductive layer by an insulative layer, the opening extending to an interconnect underlying the conductive and insulative layers, forming a contact in the opening electrically coupled to the interconnect, and insulating the contact from the plurality of conductive layers.

In one example of a method for making a conductive structure, forming an opening comprises forming a plurality of openings, and forming the contact in the opening comprises forming a plurality of contacts in the plurality of openings.

In one example of a method for making a conductive structure, adjacent contacts of the plurality of contacts are electrically isolated from one another.

In one example of a method for making a conductive structure, adjacent contacts of the plurality of contacts are separated by at least 200 nm.

In one example, a method for making a conductive structure further comprises forming insulative liners in the openings such that the insulative liners are disposed about the contacts between the contacts and the conductive and insulative layers to insulate the contacts from the conductive layers.

In one example of a method for making a conductive structure, the insulative liners are at least about 5 nm thick.

In one example, a method for making a conductive structure comprises recessing the material of the conductive layers proximate the opening such that the insulative layer material is closer to the contact than the conductive layer material.

In one example of a method for making a conductive structure, the contacts and the conductive layer material are separated by a distance of from about 5 nm to about 75 nm.

In one example of a method for making a conductive structure, the insulative liners comprise an oxide material, a nitride material, or a combination thereof.

In one example of a method for making a conductive structure, forming the insulative liners comprises forming an oxide material layer and a nitride material layer.

In one example of a method for making a conductive structure, the oxide material layer is an outer layer and the nitride material layer is an inner layer relative to the contacts.

In one example of a method for making a conductive structure, the oxide material layer is formed in the opening followed by the nitride material layer.

In one example of a method for making a conductive structure, the opening comprises an elongated configuration.

In one example of a method for making a conductive structure, at least one of the plurality of conductive layers is electrically coupled to ground.

In one example of a method for making a conductive structure, the conductive layers comprise polysilicon, tungsten, nickel, titanium, platinum, aluminum, gold, tungsten nitride, tantalum nitride, titanium nitride, or a combination thereof.

In one example of a method for making a conductive structure, the insulative layers comprise an oxide material, a nitride material, or a combination thereof.

In one example of a method for making a conductive structure, the interconnect comprises a plurality of interconnects.

In one example of a method for making a conductive structure, each of the plurality of contacts is electrically coupled to a different one of the plurality of interconnects.

In one example there is provided a method for making a solid state memory device comprising forming an opening through a plurality of conductive layers, each conductive layer being separated from an adjacent conductive layer by an insulative layer, the opening extending to an interconnect underlying the conductive and insulative layers, the interconnect being electrically coupled to a semiconductor device, forming a contact in the opening electrically coupled to the interconnect, and insulating the contact from the plurality of conductive layers.

In one example, a method for making a solid state memory device comprises forming an opening comprises forming a plurality of openings, and forming the contact in the opening comprises forming a plurality of contacts in the plurality of openings.

In one example, a method for making a solid state memory device comprises adjacent contacts of the plurality of contacts are electrically isolated from one another.

In one example, a method for making a solid state memory device comprises adjacent contacts of the plurality of contacts are separated by at least 200 nm.

In one example, a method for making a solid state memory device further comprises forming insulative liners in the openings such that the insulative liners are disposed about the contacts between the contacts and the conductive and insulative layers to insulate the contacts from the conductive layers.

In one example, a method for making a solid state memory device comprises the insulative liners are at least about 5 nm thick.

In one example, a method for making a solid state memory device further comprises recessing the material of the conductive layers proximate the opening such that the insulative layer material is closer to the contact than the conductive layer material.

In one example, a method for making a solid state memory device comprises the contacts and the conductive layer material are separated by a distance of from about 5 nm to about 75 nm.

In one example, a method for making a solid state memory device comprises the insulative liners comprise an oxide material, a nitride material, or a combination thereof.

In one example, a method for making a solid state memory device comprises forming the insulative liners comprises forming an oxide material layer and a nitride material layer.

In one example, a method for making a solid state memory device comprises the oxide material layer is an outer layer and the nitride material layer is an inner layer relative to the contacts.

In one example, a method for making a solid state memory device comprises the oxide material layer is formed in the opening followed by the nitride material layer.

In one example, a method for making a solid state memory device comprises the opening comprises an elongated configuration.

In one example, a method for making a solid state memory device comprises at least one of the plurality of conductive layers is electrically coupled to ground.

In one example, a method for making a solid state memory device comprises the conductive layers comprise polysilicon, tungsten, nickel, titanium, platinum, aluminum, gold, tungsten nitride, tantalum nitride, titanium nitride, or a combination thereof.

In one example, a method for making a solid state memory device comprises the insulative layers comprise an oxide material, a nitride material, or a combination thereof.

In one example, a method for making a solid state memory device comprises the interconnect comprises a plurality of interconnects.

In one example, a method for making a solid state memory device comprises each of the plurality of contacts is electrically coupled to a different one of the plurality of interconnects.

In one example, a method for making a solid state memory device further comprises forming a barrier extending through the conductive and insulative layers.

In one example, a method for making a solid state memory device comprises forming the barrier comprises forming a slot that extends through the conductive and insulative layers.

In one example, a method for making a solid state memory device comprises the openings and the slot are formed simultaneously.

In one example, a method for making a solid state memory device comprises forming the barrier comprises disposing insulative material in the slot proximate the conductive layers.

In one example, a method for making a solid state memory device comprises the insulative liners are formed in the openings at the same time that insulative material is disposed in the slot.

In one example, a method for making a solid state memory device comprises the insulative material fills a width of the slot.

In one example, a method for making a solid state memory device comprises the insulative material of the barrier comprises an oxide material, a nitride material, or a combination thereof.

In one example, a method for making a solid state memory device comprises disposing insulative material in the slot comprises forming a layer of insulative material in the slot proximate the conductive layers.

In one example, a method for making a solid state memory device comprises the insulative material is disposed across a top of the slot.

In one example, a method for making a solid state memory device further comprises disposing conductive material in the slot.

In one example, a method for making a solid state memory device comprises the contacts are formed in the openings at the same time that conductive material is disposed in the slot.

In one example, a method for making a solid state memory device further comprises removing the conductive material from the slot.

In one example, a method for making a solid state memory device comprises the conductive material of the barrier comprises polysilicon, tungsten, nickel, titanium, platinum, aluminum, gold, tungsten nitride, tantalum nitride, titanium nitride, or a combination thereof.

Circuitry used in electronic components or devices (e.g. a die) of an electronic device package can include hardware, firmware, program code, executable code, computer instructions, and/or software. Electronic components and devices can include a non-transitory computer readable storage medium which can be a computer readable storage medium that does not include signal. In the case of program code execution on programmable computers, the computing devices recited herein may include a processor, a storage medium readable by the processor (including volatile and non-volatile memory and/or storage elements), at least one input device, and at least one output device. Volatile and non-volatile memory and/or storage elements may be a RAM, EPROM, flash drive, optical drive, magnetic hard drive, solid state drive, or other medium for storing electronic data. Node and wireless devices may also include a transceiver module, a counter module, a processing module, and/or a clock module or timer module. One or more programs that may implement or utilize any techniques described herein may use an application programming interface (API), reusable controls, and the like. Such programs may be implemented in a high level procedural or object oriented programming language to communicate with a computer system. However, the program(s) may be implemented in assembly or machine language, if desired. In any case, the language may be a compiled or interpreted language, and combined with hardware implementations.

While the forgoing examples are illustrative of the specific embodiments in one or more particular applications, it will be apparent to those of ordinary skill in the art that numerous modifications in form, usage and details of implementation can be made without departing from the principles and concepts articulated herein.

What is claimed is:

1. A conductive structure, comprising:
an interconnect;
a plurality of conductive layers having a first portion in a periphery region overlying the interconnect and a second portion in at least one of a memory array region or a staircase region, wherein a material of the first and second portions of the plurality of conductive layers is the same material, each conductive layer being separated from an adjacent conductive layer by an insulative layer;
a barrier having a wall configuration, the first and second portions of the plurality of conductive layers being separated from one another by the barrier;
a contact extending through the first portion of the plurality of conductive layers to the interconnect, wherein the contact is electrically coupled to the interconnect and insulated from the first portion of the plurality of conductive layers; and
an insulative liner having a plurality of insulative liner layers disposed about the contact between the contact and the conductive and insulative layers to insulate the contact from the conductive layers.

2. The conductive structure of claim 1, wherein the contact comprises a plurality of contacts.

3. The conductive structure of claim 2, wherein adjacent contacts of the plurality of contacts are electrically isolated from one another.

4. The conductive structure of claim 2, wherein adjacent contacts of the plurality of contacts are separated by at least 200 nm.

5. The conductive structure of claim 1, wherein at least two of the plurality of insulative liner layers comprise different materials.

6. The conductive structure of claim 1, wherein the insulative liner is at least about 5 nm thick.

7. The conductive structure of claim 1, wherein the insulative layer material is closer to the contacts than the conductive layer material.

8. The conductive structure of claim 1, wherein the contacts and the conductive layer material are separated by a distance of from about 5 nm to about 75 nm.

9. The conductive structure of claim 1, wherein the plurality of insulative liner layers comprises an oxide material, a nitride material, or a combination thereof.

10. The conductive structure of claim 1, wherein a first of the plurality of insulative liner layers comprises an oxide material layer and a second of the plurality of insulative liner layers comprises a nitride material layer.

11. The conductive structure of claim 10, wherein the oxide material layer is an outer layer and the nitride material layer is an inner layer relative to the contacts.

12. The conductive structure of claim 2, wherein the interconnect comprises a plurality of interconnects.

13. The conductive structure of claim 12, wherein each of the plurality of contacts is electrically coupled to a different one of the plurality of interconnects.

14. The conductive structure of claim 1, wherein the contact is separated from the plurality of conductive layers by insulative material.

15. The conductive structure of claim 1, wherein the contact comprises a column configuration.

16. The conductive structure of claim 1, wherein at least one of the plurality of conductive layers is electrically coupled to ground.

17. The conductive structure of claim 1, wherein the conductive layers comprise polysilicon, tungsten, nickel, titanium, platinum, aluminum, gold, tungsten nitride, tantalum nitride, titanium nitride, or a combination thereof.

18. The conductive structure of claim 1, wherein the insulative layer comprises an oxide material, a nitride material, or a combination thereof.

19. A method for making a conductive structure, comprising:
forming an opening through a first portion of a plurality of conductive layers in a periphery region, the plurality of conductive layers having a second portion in at least one of a memory array region or a staircase region, wherein a material of the first and second portions of the plurality of conductive layers is the same material, each conductive layer being separated from an adjacent conductive layer by an insulative layer, the opening extending to an interconnect underlying the conductive and insulative layers;
forming a contact in the opening electrically coupled to the interconnect; and
insulating the contact from the first portion of the plurality of conductive layers with an insulative liner having a plurality of insulative liner layers disposed about the contact between the contact and the conductive and insulative layers, wherein the first and second portions of the plurality of conductive layers are separated from one another by a barrier having a wall configuration.

20. The method of claim 19, wherein forming an opening comprises forming a plurality of openings, and forming the contact in the opening comprises forming a plurality of contacts in the plurality of openings.

21. The method of claim 19, wherein the opening comprises an elongated configuration.

22. The method of claim 19, wherein at least one of the plurality of conductive layers is electrically coupled to ground.

23. The method of claim 19, wherein the conductive layers comprise polysilicon, tungsten, nickel, titanium, platinum, aluminum, gold, tungsten nitride, tantalum nitride, titanium nitride, or a combination thereof.

24. The method of claim 19, wherein the insulative layers comprise an oxide material, a nitride material, or a combination thereof.

* * * * *